(12) United States Patent
Liu et al.

(10) Patent No.: US 10,916,310 B2
(45) Date of Patent: Feb. 9, 2021

(54) MEMORY SYSTEM, MEMORY CONTROLLER, AND MEMORY CONTROL METHOD

(71) Applicant: Macronix International Co., Ltd., Hsinchu (TW)

(72) Inventors: Yi-Chun Liu, Zhubei (TW); Yiching Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 16/408,526

(22) Filed: May 10, 2019

(65) Prior Publication Data
US 2020/0357472 A1    Nov. 12, 2020

(51) Int. Cl.
| | | |
|---|---|---|
| G11C 16/04 | (2006.01) | |
| G11C 16/16 | (2006.01) | |
| G11C 16/26 | (2006.01) | |
| G11C 16/34 | (2006.01) | |

(52) U.S. Cl.
CPC .............. *G11C 16/16* (2013.01); *G11C 16/26* (2013.01); *G11C 16/3427* (2013.01); *G11C 16/3445* (2013.01); *G11C 16/3459* (2013.01)

(58) Field of Classification Search
CPC ..... G11C 16/16; G11C 16/26; G11C 16/3427; G11C 16/3445; G11C 16/3459
USPC .................................................... 365/185.29
See application file for complete search history.

(56) References Cited

U.S. PATENT DOCUMENTS

| | | | |
|---|---|---|---|
| 6,507,522 B2 | 1/2003 | Lee et al. | |
| 6,515,910 B1 * | 2/2003 | Lee .................... | G11C 16/3404 |
| | | | 365/185.09 |
| 8,275,931 B2 | 9/2012 | Yeh | |
| 8,654,580 B2 | 2/2014 | Kang et al. | |
| 8,923,053 B2 | 12/2014 | Han et al. | |

(Continued)

FOREIGN PATENT DOCUMENTS

WO    WO 2016/118234     7/2016

OTHER PUBLICATIONS

Extended European Search Report issued in related EP Application No. 19178106.1 dated Jan. 7, 2020, 8 pages.

(Continued)

*Primary Examiner* — Huan Hoang
(74) *Attorney, Agent, or Firm* — Fish & Richardson P.C.

(57) ABSTRACT

Methods, systems and apparatus including computer-readable mediums for partially erasing blocks in a memory system to increase reliability are provided. In one aspect, a memory system includes a memory having a plurality of blocks and a memory controller coupled to the memory. The memory controller is configured to: execute a first erase operation on a particular block in the memory, the particular block including multiple sub-blocks each having respective memory cells, one or more memory cells in the particular block being in one or more programmed states before the first erase operation, then execute a second erase operation on a first sub-block of the particular block such that first respective memory cells of the first sub-block are in an erased state after the second erase operation. The memory controller can be configured to not execute the second erase operation on the one or more other sub-blocks of the particular block.

25 Claims, 7 Drawing Sheets

(56) References Cited

U.S. PATENT DOCUMENTS

2014/0047164 A1* 2/2014 Nemazie ............. G06F 12/0246
                                                    711/103
2016/0141041 A1   5/2016 Yang et al.
2019/0074062 A1* 3/2019 Chen ................... G11C 16/0483
2019/0237144 A1* 8/2019 Kim .................... G11C 16/0483

OTHER PUBLICATIONS

Taiwan Intellectual Property Office Communication issued in related TW Application No. 10920827510 dated Sep. 1, 2020, 1 page.

* cited by examiner

MEMORY SYSTEM, MEMORY CONTROLLER, AND MEMORY CONTROL METHOD

BACKGROUND

Some memory systems suffer from read disturbance effects caused by repeated read operations, which may impact data integrity. Particularly, as a size of a memory block, e.g., in a three-dimensional (3D) memory, increases, the read disturbance effects become larger, and some memory pages in the memory block may be not in an exact erased state before programming, which may worsen the reliability of the memory. In some cases, even if a memory block experiences less read disturbance effect after erase, some pages may be unrecoverably damaged if the pages are kept blank (or unprogrammed) for a very long time.

SUMMARY

The present disclosure describes systems and techniques for partially erasing memory blocks in memory systems, e.g., non-volatile memory systems such as 3D NAND or NOR flash memory, to increase reliability of the memory systems, e.g., by performing a coarse erase of a whole block and then a fine erase of one or more sub-blocks in the block.

One aspect of the present disclosure features a memory system, including a memory including a plurality of blocks; and a memory controller coupled to the memory and configured to: execute a first erase operation on a particular block in the memory, the particular block including multiple sub-blocks each having respective memory cells, where, before the first erase operation, one or more memory cells in the particular block are in one or more programmed states; then execute a second erase operation on a first sub-block of the particular block such that first respective memory cells of the first sub-block are in an erased state after the second erase operation.

Memory cells of one or more other sub-blocks of the particular block can remain in the same states as that of the memory cells of the one or more other sub-blocks after the first erase operation. The memory controller can be configured to not execute the second erase operation on the one or more other sub-blocks of the particular block. The memory controller can be configured to execute the second erase operation only on the first sub-block of the particular block.

In some implementations, after the first erase operation and before the second erase operation, states of the memory cells in the particular block are distributed between the erased state and one of the programmed states. After the first erase operation, at least one of the memory cells in the particular block can be in the one of the programmed states.

The first erase operation can be executed without a verifying operation for verifying whether the memory cells of the particular block are in the erased state.

In some implementations, the memory controller is configured to execute the second erase operation by applying an erasing voltage on the first respective memory cells and then verifying states of the first respective memory cells. The memory controller can be configured to: determine that at least one of the first respective memory cells is in one of the programmed states, and in response, apply the erasing voltage again on the first respective memory cells. The memory controller can be configured to verify the states of the first respective memory cells after applying the erasing voltage again.

The memory controller can be configured to determine to program data in the particular block, and the first erase operation can be executed on the particular block in response to the determining to program the data in the particular block.

The memory controller can be configured to determine to program data in the first sub-block, and the second erase operation can be executed on the first sub-block in response to the determining to program the data in the first sub-block.

In some implementations, the memory controller is configured to: after the second erase operation, program data in the first respective memory cells of the first sub-block. The first sub-block can include a plurality of memory pages, and the memory controller can be configured to sequentially program the data in the plurality of memory pages of the first sub-block. The memory controller can be configured to: program first part of the data in a first memory page of the plurality of memory pages; and program second part of the data in a second memory page of the plurality of memory pages. The memory controller can be configured to: suspend programming of the data into the plurality of memory pages after programming first part of the data in a first memory page of the plurality of memory pages; and after one or more other operations are completed, resume programming of a second part of the data into a second memory page of the plurality of memory pages.

In some cases, the memory controller is configured to suspend operations on the particular block after the first erase operation on the particular block and resume the operations on the particular block including executing the second erase operation on the first sub-block of the particular block.

In some cases, the memory controller is configured to: execute a third erase operation on a second sub-block of the particular block such that second respective memory cells of the second sub-block are in the erased state after the third erase operation, where one or more second other sub-blocks of the particular block remain without execution of the third erase operation, the one or more second other sub-blocks including the first sub-block. The third erase operation can be executed on the second sub-block after the first sub-block is filled up with programmed data.

In some implementations, the memory controller is configured to execute a program operation on the particular block such that at least one of the memory cells is programmed from the erased state to be in one of the programmed states, where the program operation is executed after the first erase operation and before the second erase operation. The memory controller can be configured to execute the program operation by applying one or more programming pulses on the memory cells of the particular block, and the program operation can be executed without a verifying operation for verifying states of the memory cells of the particular block. After the program operation, the states of the memory cells of the particular block can be distributed between the erased state and the one of the programmed states.

The memory controller can be configured to: execute the first erase operation by issuing a first erase command including a first code and an address of the particular block, and execute the second erase operation by issuing a second erase command including a second code and an address of the first sub-block of the particular block, the second code being different from the first code.

The memory can be a three-dimensional (3D) memory, and each of the blocks can be a 3D block including multiple two-dimensional (2D) blocks, and each sub-block of the particular block can include one or more 2D blocks.

Before the second erase operation, states of memory cells in a second block of the plurality of blocks in the memory can be distributed between the erased state and one of the programmed states. The memory controller can be configured to apply the first erase operation to the second block in the memory.

Another aspect of the present disclosure features a memory controller, including at least one processor and at least one non-transitory machine-readable storage medium coupled to the at least one processor having machine-executable instructions stored thereon that, when executed by the at least one processor, cause the at least one processor to perform operations including: executing a first erase operation on a particular block in a memory, the particular block including multiple sub-blocks each having respective memory cells, where, before the first erase operation, one or more memory cells in the particular block are in one or more programmed states; then executing a second erase operation on a first sub-block of the particular block such that first respective memory cells of the first sub-block are in an erased state after the second erase operation.

The operations can further include: executing a program operation on the particular block such that at least one of the memory cells is programmed from the erased state to be in one of the programmed states, where the program operation is executed after the first erase operation and before the second erase operation, and the program operation is executed without a verifying operation for verifying states of the memory cells of the particular block.

A further aspect of the present disclosure features a method performed by a memory controller coupled to a memory, including: executing a first erase operation on a particular block in the memory, the particular block including multiple sub-blocks each including respective memory cells, where, before the first erase operation, one or more memory cells in the particular block are in one or more programmed states; then executing a second erase operation on a first sub-block of the particular block such that first respective memory cells of the first sub-block are in an erased state after the second erase operation.

The method can further include: executing a program operation on the particular block such that at least one of the memory cells is programmed from the erased state to be in one of the programmed states, where the program operation is executed after the first erase operation and before the second erase operation, and the program operation is executed without a verifying operation for verifying states of the memory cells of the particular block.

The techniques can be implemented for any type of controllers to increase reliability of a memory that suffers from read disturbance and/or other disturbance effects. The techniques apply multiple stage erases on blocks and associated sub-blocks. Particularly, when a controller assigns a block to program data, the controller can first coarsely erase a whole block to change a state distribution of memory cells in the block such that more memory cells are in a middle state (e.g., a state between an erased state and a programmed state). Then the controller can perform a fine erase on a sub-block to shift the state distribution from the middle state to the erased state before the controller starts to program the data in the sub-block. The fine erase can eliminate read disturbance issues from other sub-blocks on the sub-block. In some cases, after the coarse erase and before the fine erase, the controller can also execute a soft program (e.g., for shifting some memory cells away from an erased state) to prevent unrecoverable damage (e.g., due to keeping these memory cells blank for a long time). The operations on the block can be suspended and resumed. For example, after the coarse erase, the controller can suspend a soft program or fine erase operation to perform other operations, and then resume performance of the soft program operation on the block or the fine erase operation on the sub-block. The controller can set up different command codes for different operations (e.g., including normal erase operation, coarse erase operation, fine erase operation, soft program operation, and normal program operation). The controller can use a "set feature" command to rearrange parameters inside the memory. By partially erasing a memory block, the techniques also enable conserving program/erase (P/E) cycles and increasing the life-span of the memory block.

The techniques can be applied to various memory types, such as SLC (single-level cell) devices, or MLC (multi-level cell) devices like 2-level cell devices, TLC (triple-level cell) devices, or QLC (quad-level cell) devices. The techniques can be applied to various dimensions of memory systems, such as two-dimensional (2D) memory systems or three-dimensional (3D) memory systems. The techniques can be applied to various types of non-volatile memory systems, such as NAND flash memory, NOR flash memory, among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

Figure 1A:
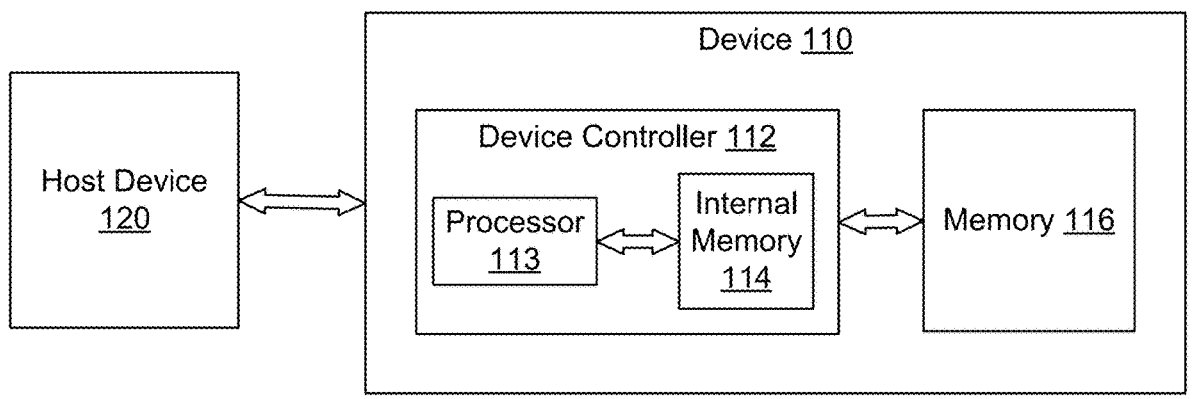
FIG. 1A illustrates an example of a system including a memory device, according to one or more implementations.

FIG. 1A illustrates an example of a system 100 for erasing and/or programming data. The system 100 includes a device 110 and a host device 120. The device 110 includes a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. For illustration purposes only, the following description uses a NAND flash memory as an example of the memory 116.

Figure 1B:
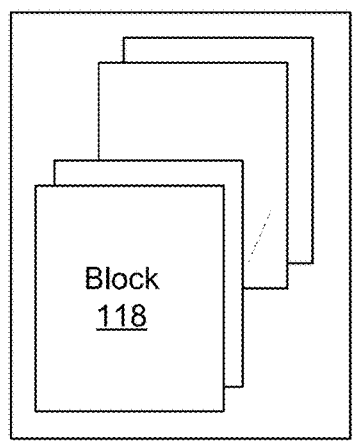
FIG. 1B illustrates an example of a memory including memory blocks, according to one or more implementations.

FIG. 1B illustrates an example configuration of the memory 116 that includes a plurality of blocks 118. The memory 116 can be a two-dimensional (2D) memory or a three-dimensional (3D) memory.

Figure 1C:
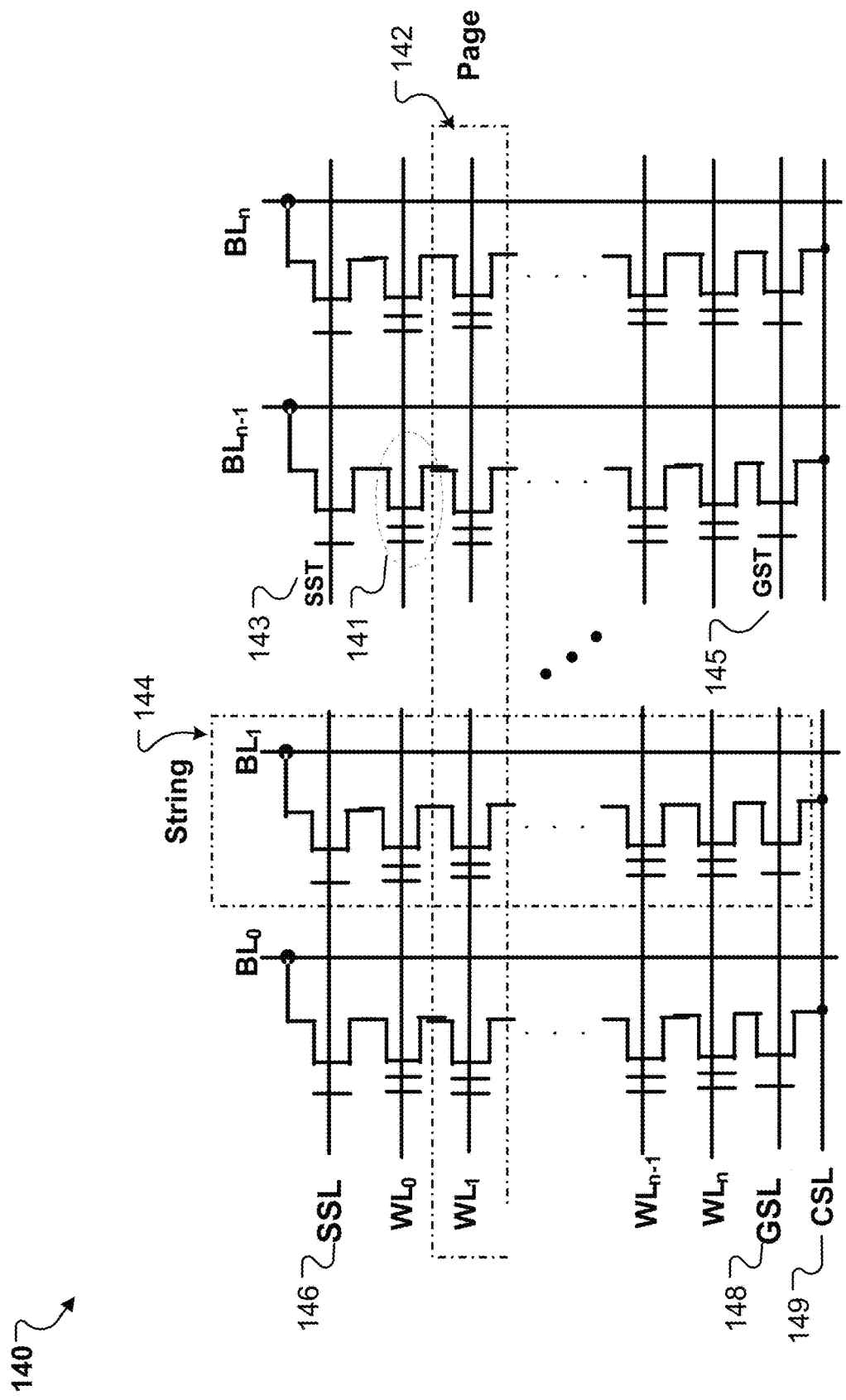
FIG. 1C illustrates an example block of a 2D memory, according to one or more implementations.

FIG. 1C illustrates an example configuration of a two-dimensional (2D) memory block 140 when the memory 116 is a 2D memory. The block 140 can be the block 118. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142.

The block 140 can include multiple sub-blocks. Each sub-block can include one or more cell pages 142. Each sub-block can have identical number of cell pages 142 or different number of cell pages 142. Each sub-block can have a starting address and an ending address that can be defined by addresses of the cell pages in the sub-block.

A cell string 144 can include a number of memory cells 141, a source select transistor (SST) 143, and a ground select transistor (GST) 145, which are all connected in series. A gate of the SST 143 is connected to a string select line (SSL) 146. Gates of the SSTs in different strings are also connected to the same SSL. Gates of the memory cells 141 are respectively connected to word lines $WL_0$, $WL_1$, ..., $WL_{0-1}$, $WL_n$. The memory cells 141 are connected to a common source line (CSL) 149 via the GST 145. A gate of the GST 145 is connected to a ground select line (GSL) 148. Gates of the GSTs in different strings are also connected to the same GSL. A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142.

To read a particular cell page 142 in the block 140 in a read operation, a lower voltage is applied onto a word line corresponding to the particular cell page 142. Meanwhile, a higher voltage is applied onto the other cell pages in the block 140. When the particular cell page 142 is read a large number of times, the higher voltages can be repeatedly applied onto the other cell pages with the same large number of times, which may cause read disturbance on the other cell pages.

The device 110 can include a Flash Translation Layer (FTL) to manage read, write, and erase operations. The FTL can be stored in the device controller 112, e.g., in the internal memory 114. The FTL uses a logical-to-physical (L2P) address mapping table storing mapping from logical pages in a logical block to physical pages in a physical block.

Figure 1D:
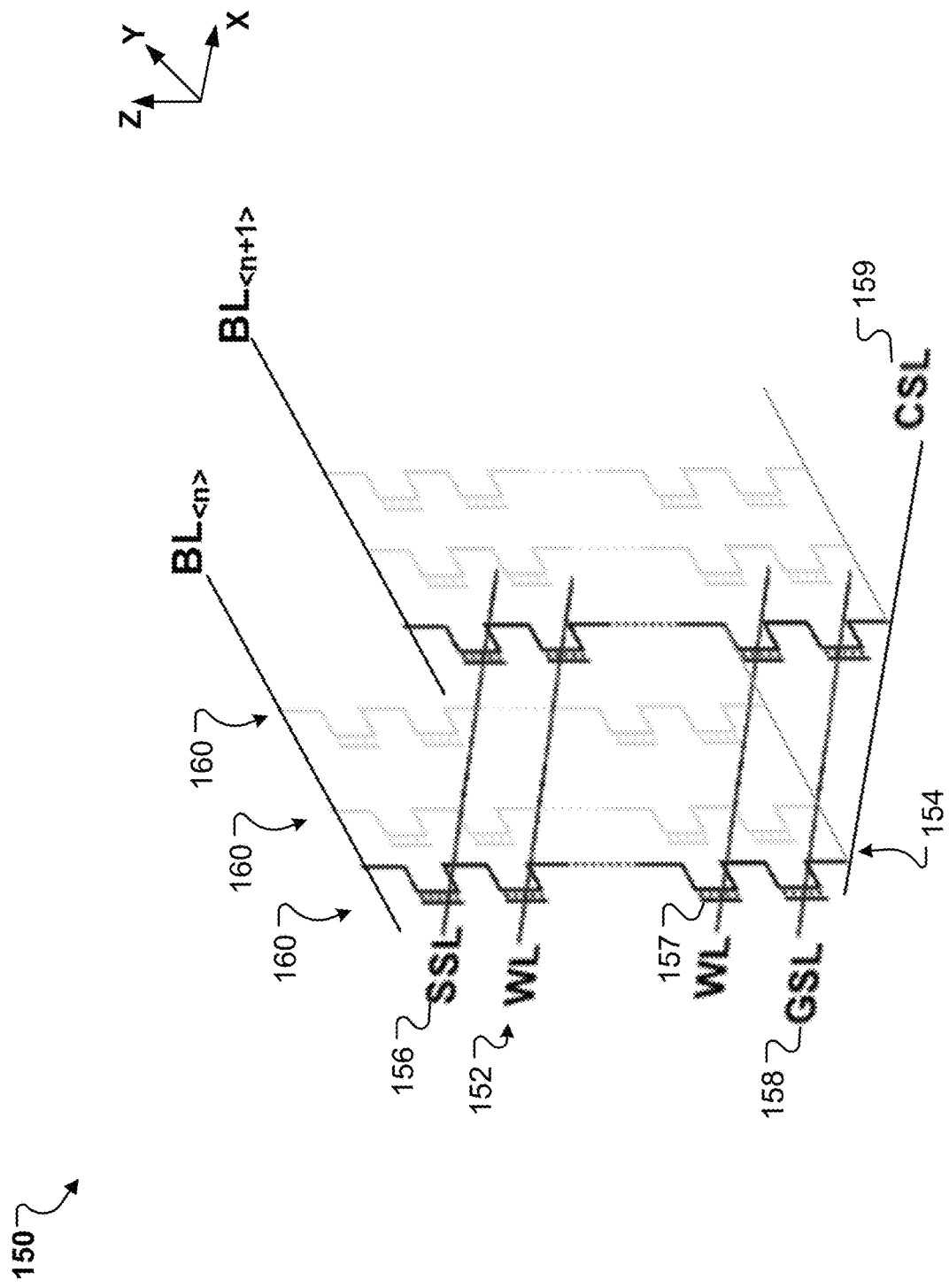
FIG. 1D illustrates an example block of a 3D memory, according to one or more implementations.

FIG. 1D illustrates an example 3D memory block 150 when the memory 116 is a 3D memory. The memory block 150 can be the block 118. Memory cells 160 are arranged in three dimensions, e.g., in an XYZ coordinate system, and coupled to a number of word lines to form a number of cell pages 152 and a number of bit lines to form a number of cell strings 154. A cell string 154 includes a number of memory cells 160 connected in series, where a memory cell 160 can be configured as an SST coupled to a string select line (SSL) 156 and a memory cell 160 can be configured as a GST coupled to a ground select line (GSL) 158. The memory cells 160 are connected to a common source line (CSL) 159 via the GSTs.

The memory block 150 can include a number of memory layers 160 stacked together, e.g., vertically along a Z direction. Each memory layer 160 can be a two-dimensional planar layer, e.g., in an X-Y plane, containing a number of cell pages 152. Each cell page 152 can be individually read and/or programmed.

To read a particular cell page 152 in a memory layer 160 in a read operation, a lower voltage is applied onto a word line corresponding to the particular cell page 152. The lower voltage is also applied onto other cell pages 152 in the memory layers 160. Meanwhile, a higher voltage is applied onto the other memory layers in the block 150. When the particular cell page 152 is read a large number of times, the higher voltages will be applied onto the other memory layers with the same large number of times, which may cause read disturbance.

The memory block 150 can include multiple sub-blocks. Each sub-block can include one or more memory layers 160. Each sub-block can have identical number of memory layers 160 or different number of memory layers 160. Each sub-block can have a starting address and an ending address that can be defined by addresses of the memory layers 160 in the sub-block. Each sub-block can be individually erased and/or verified.

Figure 2:
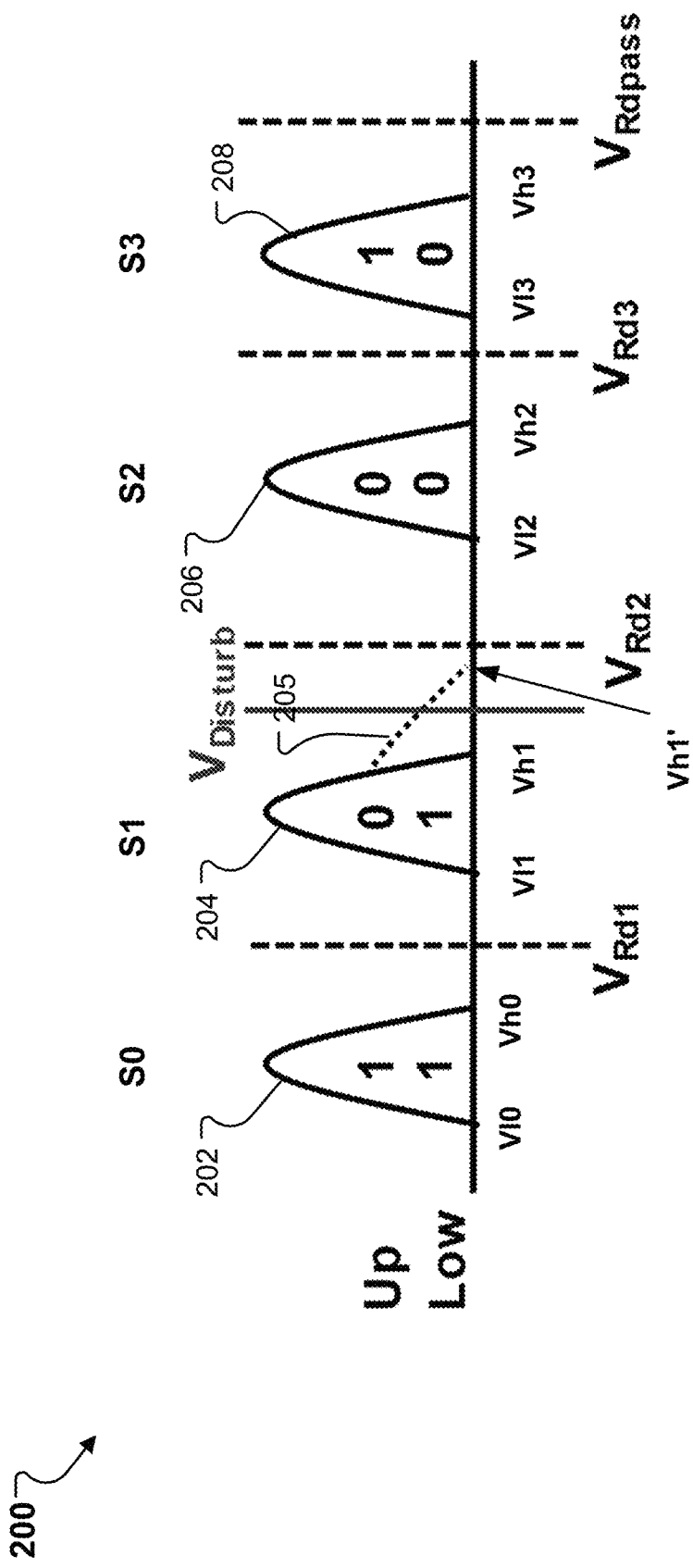
FIG. 2 illustrates an example of threshold voltage distributions and read voltages of memory cells for different states, according to one or more implementations.

FIG. 2 illustrates an example 200 of threshold voltage distributions and read voltages of a memory cell, e.g., the memory cell 141 of FIG. 1C, for different states. The memory cell can be an MLC capable of storing two-bit data. The memory cell can be programmed or erased, e.g., by a memory controller like the controller 112 of FIG. 1A, to have any one of four states S0, S1, S2, and S3. In some examples, S0 is an erased state (1,1), and S1, S2, S3 are programmed states P1 (0, 1), P2 (0, 0), and P3 (1, 0). Once programmed or erased, the memory cell has a corresponding threshold voltage. The threshold voltage is a characteristic of the memory cell. The memory cell can be a floating gate transistor or charge trap transistor. When a read voltage higher than or identical to the threshold voltage is applied to a gate of the memory cell, the memory cell can be turned on. When a read voltage lower than the threshold voltage is applied to a gate of the memory cell, the memory cell can be turned off. The read action is not a programmed or erased action and not intended to change a state of the memory cell.

Each state corresponds to a distribution of threshold voltages between a range between a lower limit voltage and a higher limit voltage. A memory cell having a threshold voltage within the range is considered to be in the corresponding state. In other words, a memory cell being in a state has a threshold voltage within the range. For example, if the memory cell has a threshold voltage between Vl0 and Vh0, the memory cell is in the state S0; if the memory cell has a threshold voltage between Vl1 and Vh1, the memory cell is in the state S1; if the memory cell has a threshold voltage between Vl2 and Vh2, the memory cell is in the state S2; and if the memory cell has a threshold voltage between Vl3 and Vh3, the memory cell is in the state S3. Curves 202, 204, 206, 208 show threshold voltage distributions of the respective states S0, S1, S2, S3 of the memory cell, respectively.

During a normal program operation, a memory cell is programmed from an erased state S0 to a desired programmed state S1, S2, or S3 by applying a programming voltage on the memory cell and verifying whether the programmed memory cell is in the desired programmed state. The verifying action can use a verifying voltage, e.g., a threshold voltage of the desired programmed state such as a voltage between Vl1 and Vh1 for S1, a voltage between Vl2 and Vh2 for S2, or a voltage between Vl3 and Vh3 for S3, to verify whether the memory cell is programmed to the desired programmed state (e.g., S1, S2, or S3). The program/verify cycle may repeat multiple times until the memory cell is programmed and verified to be in the desired programmed state.

During a read operation, a read voltage can be applied to a word line coupled to a gate of the memory cell to determine whether the selected memory cell is a turned-on or turned-off state. When a read voltage $V_{Rd1}$ that is larger than the threshold voltage of S0 but smaller than the threshold voltage of S1 is applied, the memory cell is turned on when it has the state S0 and turned off when it has the state S1, S2, or S3; when a read voltage $V_{Rd2}$ that is larger than the threshold voltage of S1 but smaller than the threshold voltage of S2 is applied, the memory cell is turned on when it has the state S0 or S1 and turned off when it has the state S2, or S3; when a read voltage $V_{Rd3}$ that is larger than the threshold voltage of S2 but smaller than the threshold voltage of S3 is applied, the memory cell is turned on if it has the state S0, S1, or S2 and off when it has the state S3. When the read voltage $V_{Rdpass}$ that is larger than all the threshold voltages of the states S0, S1, S2, S3 is applied, the memory cell is turned on regardless of whatever state the memory cell had.

Due to repeated read operations, a read disturbance phenomenon may occur. In the read disturbance phenomenon, a threshold voltage of the memory cell abnormally increases. As illustrated in FIG. 2, in some cases, the distribution curve 204 for the state S1 includes a higher threshold voltage (illustrated by a dotted curve 205). For example, the new higher limit voltage Vh1' is larger than the higher limit voltage Vh1. When a read voltage $V_{Disturb}$ is applied, the memory cell having a threshold voltage in the state S1 becomes a turned-off state instead of a turned-on state. Thus, by detecting whether the memory cell is on or off under a specific read condition, it can be determined that whether or not the memory cell suffers from read disturbance. In some cases, memory cells being in states having lower threshold voltages, e.g., S0 and S1, are susceptible to read disturbance.

As noted above, memory cells can be erased, e.g., in a block, a sub-block or other units, in an erase operation prior to programming. In some implementations, the memory cells are erased by raising a p-well region of the memory cells to an erase voltage for a period of time and grounding word lines of a selected block or unit (that are connected to gates of the memory cells), while source and bit lines are floating. The erase voltage can be higher than a threshold voltage for the memory cells. In blocks or units that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to tunnel oxide layers of selected memory cells and the selected memory cells are erased as electrons of the floating gates are emitted to the substrate side, e.g., by Fowler-Nordheim tunneling mechanism. As electrons are transferred from the floating gate to the p-well region, the threshold voltage of a selected cell is lowered.

After the erase voltage is applied to erase the memory cells, the erased memory cells in the block or unit can be in the erased state (e.g., S0) or in one or more programmed states (e.g., S1, S2, or S3). The states of the erased memory cells can have a distribution between the erase state and one of the programmed states (e.g., S1, S2, or S3). The memory controller can execute a verifying or reading back operation to verify whether or not the erased memory cells are in the erased state, e.g., by applying a verify voltage Vh0. If the threshold voltage of a given memory cell is below Vh0, the memory controller can determine the memory cell is properly erased to be in the erased state.

If the memory controller determines that the erased memory cells are not all in the erased state, the memory controller can apply the erase voltage again to erase the memory cells and verify again whether or not all the erased memory cells are in the erased state. The erase-verify cycle can repeat a number of times (e.g., 3, 4 or 5 times) until the memory cells are verified to be in the erased state.

Figure 3:
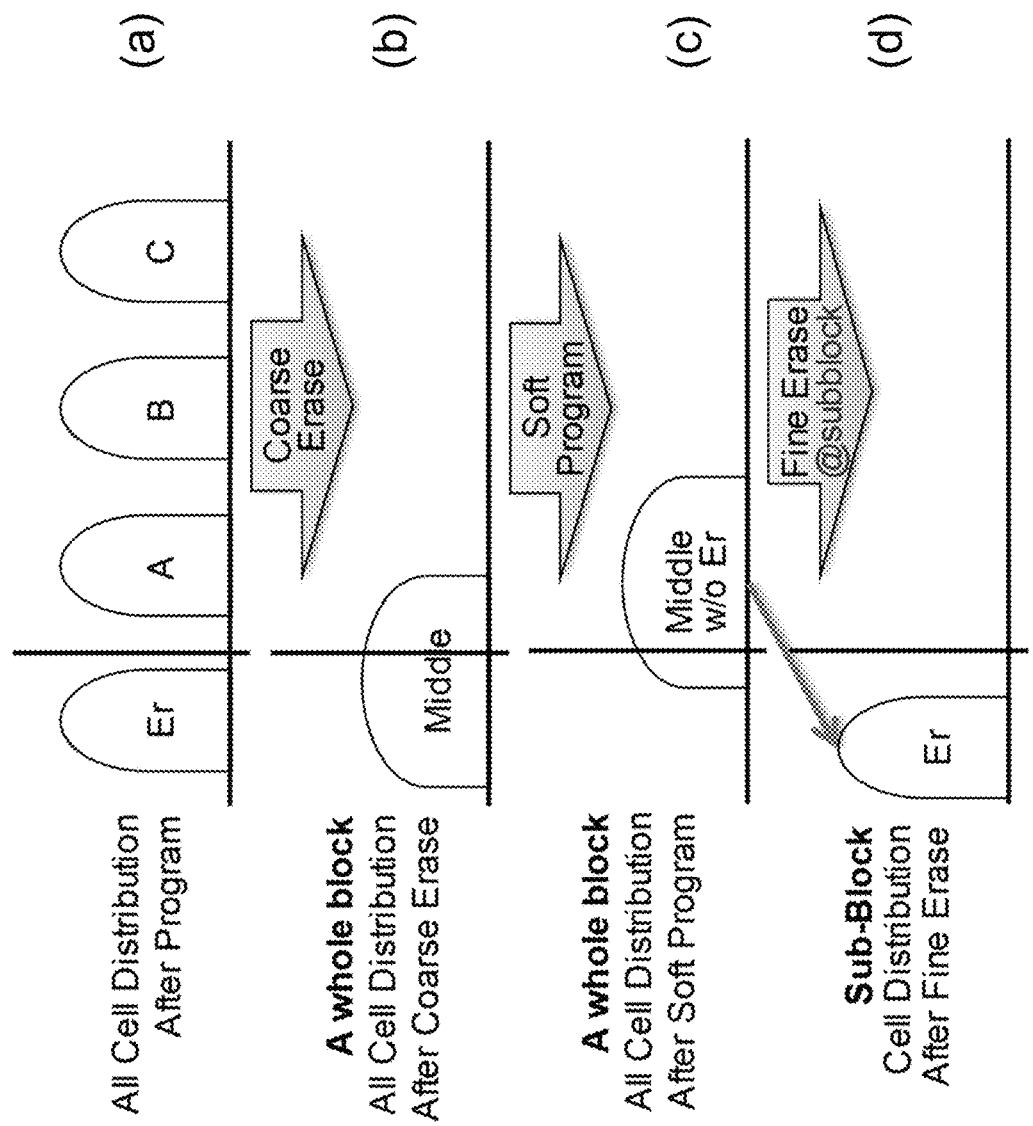
FIG. 3 illustrates examples of threshold voltage distributions of memory cells after different operations on a memory block, according to one or more implementations.

FIG. 3 illustrates examples of threshold voltage distributions of memory cells after different operations on a memory block, according to one or more implementations. The operations can be performed by a memory controller, e.g., the controller 112 of FIG. 1A. The memory block can be a 2D block, e.g., the block 140 of FIG. 1C, or a 3D block, e.g., the block 150 of FIG. 1D. The memory cells can be multi-level cells (MLCs). A memory cell can be erased or programmed to be in any one of four states Er, A, B, and C, e.g., S0, S1, S2, and S3 of FIG. 2. Er represents an erased state.

Diagram (a) of FIG. 3 show a state distribution of the memory cells after the memory block is programmed. A first number of memory cells are in the erased state, a second number of memory cells are in the programmed state A, a third number of memory cells are in the programmed state B, and a fourth number of memory cells are in the programmed state C.

Figure 5:
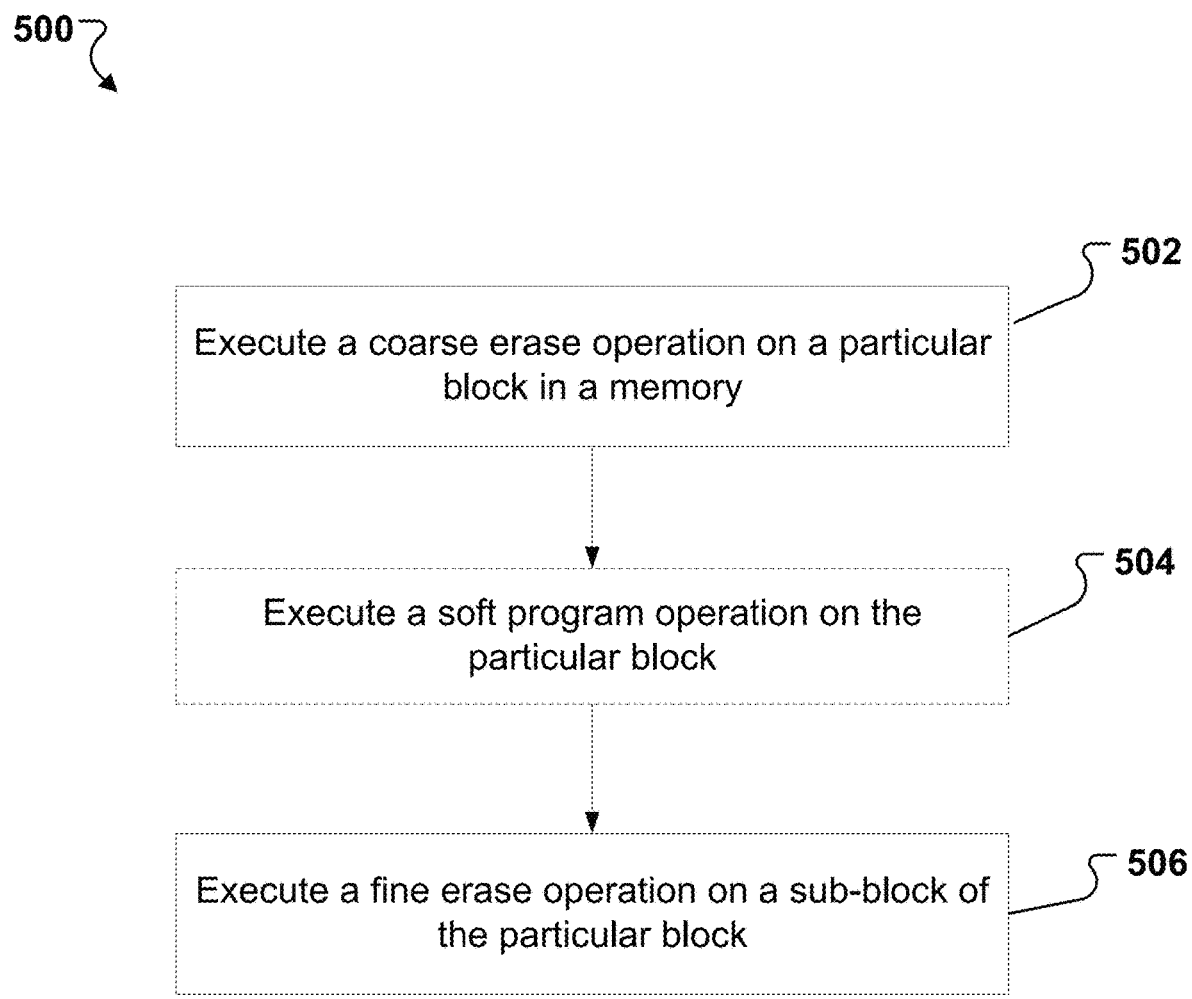
FIG. 5 is a flow chart of a process of partially erasing a memory block in a memory, according to one or more implementations.

As discussed with further details in FIG. 5, the memory controller can perform a coarse erase operation on the whole block, then optionally a soft program operation on the whole block, and then a fine erase operation on a sub-block.

As noted above, during a normal erase operation, the memory controller may repeat erase-verify cycle multiple times until the memory cells in a block or a unit are properly erased to the erased state. The coarse erase operation can include one or more steps of the normal erase operation. For example, the coarse erase operation can include just the first step, e.g., applying an erase voltage once on the memory cells of the whole block. The coarse erase operation can be executed without a verification step for verifying whether the memory cells are in the erased state. In some cases, the coarse erase operation includes a verification step after the first erasing step. The coarse erase operation may include a second erasing step after the verification step. Diagram (b) of FIG. 3 shows a state distribution of the memory cells after the coarse erase operation on the whole block. More memory cells are in a middle state (including not only erased state Er but also one or more programmed states) than in the erased state Er or the programmed state A. For example, in a QLC case, a middle state may include Er, A, B, or other states because of the tight distribution. At least one of the memory cells can be in the programmed state A. In some cases, some memory cells may be in a deeper erased state than necessary as a result of the coarse erase operation.

Optionally, the memory controller can perform a soft program operation on the whole block. Similar to the coarse erase operation with respect to the normal erase operation, the soft program can include one or more steps of the normal program operation. For example, the soft program can just include the first programming step by applying one or more programming pulses to program the memory cells in the whole block. The soft program can be executed without the verifying step.

The soft program operation can be configured to apply one or more programming pulses to move threshold voltages of memory cells in the erased state to a threshold distribution in a programmed state, e.g., programmed state A, and/or move threshold voltages of deeper erased memory cells to a threshold distribution in the erased state. The soft program operation is executed without a following erase operation on the whole block. Diagram (c) of FIG. 3 shows a state distribution of the memory cells after the soft program operation on the whole block. Compared to the state distribution in the middle state shown in diagram (b) of FIG. 3, the state distribution moves away from the erased state and towards the programmed state A. In such a way, some memory cells that have the erased state Er for a long time can avoid suffering from unrecoverable damage.

Then, the memory controller can select a sub-block in the whole block, e.g., for programming data. The memory controller can execute a fine erase operation on memory cells in the sub-block. The fine erase operation can include multiple erase-verify cycles until the memory cells in the sub-block are properly erased and verified to be in the erased state Er. Diagram (d) of FIG. 3 shows a state distribution of the memory cells in the sub-block after the fine erase operation on the sub-block. The state distribution can be the same as the distribution of the erased state.

Figure 4:
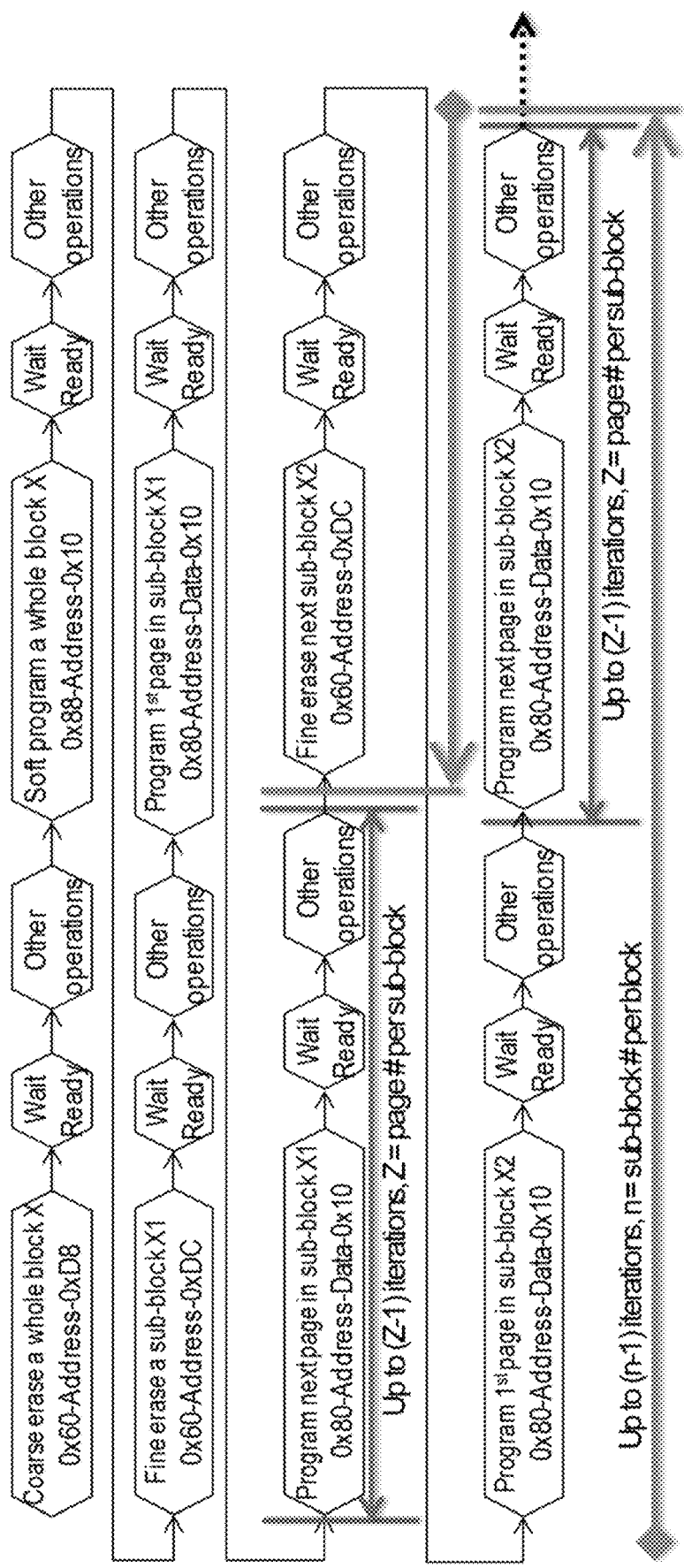
FIG. 4 shows an example of erasing a memory block and programming data in sub-blocks of the memory block, according to one or more implementations.

FIG. 4 shows an example of erasing a memory block of a memory and programming data in sub-blocks of the memory block, according to one or more implementations. The erasing and programming can be performed by a memory controller, e.g., the controller 112 of FIG. 1A. The memory block can be a 2D block, e.g., the block 140 of FIG. 1C, or a 3D block, e.g., the block 150 of FIG. 1D. The memory block can include n number of sub-blocks. Each sub-block can include Z number of memory pages. Each memory page can include a number of memory cells.

The memory controller can issue different command codes for different operations. For example, a command code for a normal erase operation can be 60-address-D0; a command code for a coarse erase operation can be 60-address-D8; a command code for a fine erase operation can be 60-address-DC; a command code for a normal program operation can be 80-address-10; and a command code for a soft program operation can be 88-address-10. The address can be a starting address, a middle address, an ending address, or an address range of a block or a sub-block. The memory controller can also use a "Set Feature" command to rearrange parameters inside the memory.

As illustrated in FIG. 4, the memory controller first executes a coarse erase operation on a whole block using a command code "0x60-Address-0xD8," where the address can be the starting address of the whole block. Then the memory controller can suspend the operation on the whole block and wait to be ready for other operations. After the other operations are completed, the memory controller resumes to execute a soft program operation on the whole block by using a command code "0x88-Address-0x10," where the address can be the starting address of the whole block. Then the memory controller suspends the operation on the whole block and resumes to execute a fine erase operation on sub-block X1 of the whole block using a command code "0x60-Address-0xDC," where the address can be the starting address of the sub-block X1.

The memory controller can then execute a normal program operation to program data on a first memory page in the sub-block X1 using a command code "0x80-Address-0x10," where the address can be the starting address of the first memory page in the sub-block X1. Then the memory controller can repeat the normal program operation (Z–1) times on the other (Z–1) memory pages of the sub-block X1, respectively, until the memory pages in the sub-block X1 are filled up with the programmed data.

Then the memory controller can execute a second fine erase operation on sub-block X2 of the whole block using a command code "0x60-Address-0xDC," where the address can be the starting address of the sub-block X2. Similar to programming Z memory pages in the sub-block X1, the memory controller can sequentially program data in the Z memory pages in the sub-block X2.

Similarly, the memory controller can sequentially execute a respective fine erase operation on each of the other sub-blocks in the whole bock and sequentially program data in Z memory pages in each of the other sub-blocks. The memory controller can partially erase the whole block, e.g., one sub-block by one sub-block, and program data in the partially erased block correspondingly. In such a way, the read-disturbance caused by operations on previous sub-blocks can be eliminated by the fine erase operation on a present sub-block.

FIG. 5 is a flow chart of a process 500 of erasing partial memory blocks in a memory, according to one or more implementations. The process 500 can be performed by a memory controller, e.g., the controller 112 of FIG. 1A. The memory can be the memory 116 of FIG. 1A. The memory includes a number of blocks. Each block can be a 2D block, e.g., the block 140 of FIG. 1C, or a 3D block, e.g., the block 150 of FIG. 1D. Each block can include n number of sub-blocks. Each sub-block can include a number of memory pages. Each memory page can include a number of memory cells. Each memory cell can be in an erased state, e.g., S0 of FIG. 2, or a programmed state, e.g., S1, S2, or S3 of FIG. 2.

A coarse erase operation is executed on a particular block in the memory (502). The memory controller can select the particular block to be programmed. The particular block may be previously programmed and one or more memory cells in the particular block may be in one or more programmed states. Thus, the particular block may be erased prior to the programming.

As noted above, the coarse erase operation can include one or more steps of a normal erase operation. In some examples, the coarse erase operation can be executed by applying an erasing voltage on the memory cells of the particular block. The coarse erase operation can be executed without a verifying operation for verifying whether the memory cells in the particular block are in the erased state. After the coarse erase operation, states of the memory cells in the particular block can have a distribution including not only the erased state but also one or more programmed states, e.g., as illustrated in diagram (b) of FIG. 3. At least one of the memory cells in the particular block can be in one of the programmed states, e.g., S1 of FIG. 2.

After the coarse erase operation, a soft program operation is optionally executed on the particular block (504). As noted above, the soft program operation is configured to move threshold voltages of memory cells in the erased state or even a deeper erased state than normal towards a programmed state. The soft program operation can include one or more steps of a normal program operation. The soft program operation can be executed by applying one or more programming pulses on the memory cells in the particular block. The soft program operation can be executed without a verifying operation for verifying whether the memory cells of the particular block are in a desired programmed state. After the soft program operation, states of the memory cells of the particular block can have a distribution between the erased state and one of the programmed states. The distribution after the soft program operation can be farther from the erased state than the distribution after the coarse erase operation. At least one of the memory cells in the particular block is programmed from the erased state to one of the programmed states.

Then, a fine erase operation is executed on a sub-block of the particular block (506). The memory controller can determine to program data in the sub-block, and the fine erase operation is executed on the sub-block in response to the determining to program the data in the sub-block. The fine erase operation is executed such that memory cells of the sub-block are in the erased state. The fine erase operation on the sub-block is not executed on one or more other sub-blocks of the particular block. In some implementations, before the fine erase operation is executed on the sub-block of the selected particular block, the coarse erase operation or other similar methods (e.g., UV (Ultra Violet) erase operation) can also be applied to one of the other blocks in the memory, which makes that the states of memory cells in that block are distributed between the erased state and one of the programmed states. In this way, these de-selected blocks can be prevented from keeping blank (unprogrammed) for a very long time.

As noted above, the fine erase operation can include multiple erase-verify cycles until the memory cells in the sub-block are properly erased and verified to be in the erased state. For example, the fine erase operation can include applying an erasing voltage on the memory cells of the sub-block and then verifying whether states of the memory cells are in the erased state. If the memory controller determines that at least one of the memory cells in the sub-block is not in the erased state or in one of the programmed states, the memory controller applies the erasing voltage again on the memory cells of the sub-block and verifies the states of the memory cells after applying the erasing voltage again.

In some implementations, after the fine erase operation is executed on the sub-block, the memory controller can program data in the memory cells of the sub-block. As illustrated in FIG. 4, the sub-block includes a number of memory pages, and the memory controller can sequentially program the data in the number of memory pages of the sub-block. For example, the memory controller can program first part of the data in a first memory page of the sub-block and program second part of the data in a second memory page of the sub-block. In some cases, the memory controller can suspend programming the data after programming the first part of the data in the first memory page. After a period of time or other operations are completed, the memory controller can resume to program the second part of the data in the second memory page.

After the memory pages in the sub-block are filled up with the programmed data, the memory controller can continue to execute a fine erase operation on a next sub-block of the particular block such that memory cells in the next sub-block are erased to be in the erased state. The fine erase operation on the next sub-block is not executed on the other sub-blocks of the particular block including the sub-block with programmed data. The memory controller can repeat same operations on each sub-block until the particular block is completely programmed, as illustrated in FIG. 4.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory system, comprising:
   a memory comprising a plurality of blocks; and
   a memory controller coupled to the memory and configured to:
      execute a first erase operation on a particular block in the memory, the particular block comprising multiple sub-blocks each having respective memory cells and the first erase operation being executed on each of the multiple sub-blocks, wherein, before the first erase operation, one or more memory cells in the particular block are in one or more programmed states; then
      select a first sub-block from the multiple sub-blocks of the particular block and execute a second erase operation on the first sub-block of the particular block such that first respective memory cells of the first sub-block are in an erased state after the second erase operation,
      wherein the first erase operation is executed without a verifying operation for verifying whether the respective memory cells of the sub-blocks in the particular block are in the erased state.

2. The memory system of claim 1, wherein, after the first erase operation and before the second erase operation, states of the respective memory cells of the sub-blocks in the particular block are distributed between the erased state and one of the one or more programmed states.

3. The memory system of claim 2, wherein, after the first erase operation, at least one of the one or more memory cells in the particular block is in the one of the one or more programmed states.

4. The memory system of claim 1, wherein the memory controller is configured to execute the second erase operation by applying an erasing voltage on the first respective memory cells and then verifying states of the first respective memory cells.

5. The memory system of claim 1, wherein the memory controller is configured to determine to program data in the particular block, and
   wherein the first erase operation is executed on the particular block in response to the determining to program the data in the particular block.

6. The memory system of claim 1, wherein the memory controller is configured to determine to program data in the first sub-block, and
   wherein the second erase operation is executed on the first sub-block in response to the determining to program the data in the first sub-block.

7. The memory system of claim 1, wherein the memory controller is configured to:
   after the second erase operation, program data in the first respective memory cells of the first sub-block.

8. The memory system of claim 7, wherein the first sub-block comprises a plurality of memory pages, and
wherein the memory controller is configured to sequentially program the data in the plurality of memory pages of the first sub-block.

9. The memory system of claim 8, wherein the memory controller is configured to:
suspend programming of the data into the plurality of memory pages after programming first part of the data in a first memory page of the plurality of memory pages; and
after one or more other operations are completed, resume programing of a second part of the data into a second memory page of the plurality of memory pages.

10. The memory system of claim 1, wherein the memory controller is configured to:
suspend operations on the particular block after the first erase operation on the particular block; and
resume the operations on the particular block including executing the second erase operation on the first sub-block of the particular block.

11. The memory system of claim 1, wherein the memory controller is configured to:
execute a third erase operation on a second sub-block of the particular block such that second respective memory cells of the second sub-block are in the erased state after the third erase operation,
wherein one or more second other sub-blocks of the particular block remain without execution of the third erase operation, the one or more second other sub-blocks including the first sub-block.

12. The memory system of claim 11, wherein the third erase operation is executed on the second sub-block after the first sub-block is filled up with programmed data.

13. The memory system of claim 1, wherein the memory controller is configured to:
execute a program operation on the particular block such that at least one of the respective memory cells of the sub-blocks in the particular block is programmed from the erased state to be in one of the one or more programmed states,
wherein the program operation is executed after the first erase operation and before the second erase operation.

14. The memory system of claim 13, wherein the memory controller is configured to execute the program operation by applying one or more programming pulses on the respective memory cells of the sub-blocks in the particular block, and
wherein the program operation is executed without a verifying operation for verifying the states of the respective memory cells of the sub-blocks in the particular block.

15. The memory system of claim 14, wherein, after the program operation, the states of the respective memory cells of the particular block are distributed between the erased state and the one of the one or more programmed states.

16. The memory system of claim 1, wherein the memory controller is configured to:
execute the first erase operation by issuing a first erase command including a first code and an address of the particular block, and
execute the second erase operation by issuing a second erase command including a second code and an address of the first sub-block of the particular block, the second code being different from the first code.

17. The memory system of claim 1, wherein, before the second erase operation, states of memory cells in a second block of the plurality of blocks in the memory are distributed between the erased state and one of the one or more programmed states.

18. The memory system of claim 17, wherein the memory controller is configured to apply the first erase operation to the second block in the memory.

19. A memory controller, comprising:
at least one processor; and
at least one non-transitory machine-readable storage medium coupled to the at least one processor having machine-executable instructions stored thereon that, when executed by the at least one processor, cause the at least one processor to perform operations comprising:
executing a first erase operation on a particular block in a memory, the particular block comprising multiple sub-blocks each having respective memory cells, wherein, before the first erase operation, one or more memory cells in the particular block are in one or more programmed states;
executing a program operation on the particular block such that at least one of the respective memory cells of the sub-blocks in the particular block is programmed from an erased state to be in one of the one or more programmed states; then
executing a second erase operation on a first sub-block of the particular block such that first respective memory cells of the first sub-block are in the erased state after the second erase operation,
wherein the program operation is executed after the first erase operation and before the second erase operation.

20. A method performed by a memory controller coupled to a memory, comprising:
executing a first erase operation on a particular block in the memory, the particular block comprising multiple sub-blocks each including respective memory cells and the first erase operation being executed on each of the multiple sub-blocks, wherein, before the first erase operation, one or more memory cells in the particular block are in one or more programmed states; then
selecting a first sub-block from the multiple sub-blocks of the particular block and executing a second erase operation on the first sub-block of the particular block such that first respective memory cells of the first sub-block are in an erased state after the second erase operation,
wherein the first erase operation is executed without a verifying operation for verifying whether the respective memory cells of the sub-blocks in the particular block are in the erased state.

21. A memory system, comprising:
a memory comprising a plurality of blocks; and
a memory controller coupled to the memory and configured to:
execute a first erase operation on a particular block in the memory, the particular block comprising multiple sub-blocks each having respective memory cells, wherein, before the first erase operation, one or more memory cells in the particular block are in one or more programmed states; then
execute a second erase operation on a first sub-block of the particular block such that first respective memory cells of the first sub-block are in an erased state after the second erase operation, wherein the first sub-block comprises a plurality of memory pages;

after the second erase operation, program data in the first respective memory cells of the first sub-block by sequentially programing the data in the plurality of memory pages of the first sub-block;

suspend programming of the data into the plurality of memory pages after programming first part of the data in a first memory page of the plurality of memory pages; and after one or more other operations are completed, resume programing of a second part of the data into a second memory page of the plurality of memory pages.

22. A memory system, comprising:

a memory comprising a plurality of blocks; and a memory controller coupled to the memory and configured to:

execute a first erase operation on a particular block in the memory, the particular block comprising multiple sub-blocks each having respective memory cells, wherein, before the first erase operation, one or more memory cells in the particular block are in one or more programmed states; then execute a second erase operation on a first sub-block of the particular block such that first respective memory cells of the first sub-block are in an erased state after the second erase operation, wherein the memory controller is further configured to:

suspend operations on the particular block after the first erase operation on the particular block; and resume the operations on the particular block including executing the second erase operation on the first sub-block of the particular block.

23. A memory system, comprising:

a memory comprising a plurality of blocks; and a memory controller coupled to the memory and configured to:

execute a first erase operation on a particular block in the memory, the particular block comprising multiple sub-blocks each having respective memory cells, wherein, before the first erase operation, one or more memory cells in the particular block are in one or more programmed states; then execute a second erase operation on a first sub-block of the particular block such that first respective memory cells of the first sub-block are in an erased state after the second erase operation, wherein the first erase operation is executed without a verifying operation for verifying whether the respective memory cells of the sub-blocks in the particular block are in the erased state, and wherein, after the first erase operation and before the second erase operation, states of the respective memory cells of the sub-blocks in the particular block are distributed between the erased state and one of the one or more programmed states.

24. A memory system, comprising:

a memory comprising a plurality of blocks; and a memory controller coupled to the memory and configured to:

execute a first erase operation on a particular block in the memory, the particular block comprising multiple sub-blocks each having respective memory cells, wherein, before the first erase operation, one or more memory cells in the particular block are in one or more programmed states; then execute a second erase operation on a first sub-block of the particular block such that first respective memory cells of the first sub-block are in an erased state after the second erase operation, wherein the first erase operation is executed without a verifying operation for verifying whether the respective memory cells of the sub-blocks in the particular block are in the erased state, and wherein, before the second erase operation, states of memory cells in a second block of the plurality of blocks in the memory are distributed between the erased state and one of the one or more programmed states.

25. The memory system of claim 24, wherein the memory controller is configured to apply the first erase operation to the second block in the memory.

* * * * *